United States Patent [19]

Reddy et al.

[11] Patent Number: 5,166,554
[45] Date of Patent: Nov. 24, 1992

[54] BOOT-STRAPPED DECODER CIRCUIT

[76] Inventors: Chitranjan N. Reddy, 1848 Country Club Dr., Milpitas, Calif. 95035; Roger D. Norwood, 730 E. Evelyn Ave., #633, Sunnyvale, Calif. 94086

[21] Appl. No.: 592,354

[22] Filed: Oct. 2, 1990

[51] Int. Cl.[5] .......................................... H03K 17/04
[52] U.S. Cl. ................................ 307/449; 307/443; 307/482; 365/230.04
[58] Field of Search ............... 307/449, 463, 448, 443, 307/542, 482; 365/230.04, 230.06

[56] References Cited

U.S. PATENT DOCUMENTS

| | | | |
|---|---|---|---|
| 4,471,240 | 9/1984 | Novosel | 307/449 X |
| 4,622,479 | 11/1986 | Taylor | 307/482 |
| 4,673,829 | 6/1987 | Gupta | 307/449 X |
| 4,678,941 | 7/1987 | Chao et al. | 307/449 |
| 4,692,638 | 9/1987 | Stiegler | 307/449 |
| 4,814,647 | 3/1989 | Tran | 307/482 |

*Primary Examiner*—David Hudspeth
*Attorney, Agent, or Firm*—Limbach & Limbach

[57] ABSTRACT

A boot-strapped decoder circuit in accordance with the present invention activates a selected word line output in response to an input address. The decoder circuit includes a plurality of row decoders, each of which has a plurality of word line outputs. The row decoders respond to a select signal that identifies one of the row decoders as a selected row decoder. The select signal is generated by a regular predecoder based on the most significant bits of the input address. Low order predecoder circuitry utilizes the least significant bits of the input address to generate a low order decoder signal. The selected row decoder includes boosting means coupled to each of the selected row decoder outputs and responsive to the low order predecode signal for generating a boot-strapped output voltage on a selected word line output of the selected row decoder.

7 Claims, 5 Drawing Sheets

BOOT-STRAPPED DECODER CIRCUIT

BACKGROUND OF THE INVENTION

1. Field of the Invention

The present invention relates to integrated circuit memory devices and, in particular, to a decoder circuit that provides a boot-strapped voltage at the output with improved speed and reliability.

2. Discussion of the Prior Art

A decoder is an integrated circuit element used extensively in the selective addressing structure of memory systems, such as dynamic random access memory (DRAM). The decoder selects and activates a particular portion of the memory storage array based on the input address applied to the decoder.

A DRAM typically utilizes a decoder circuit to boot-strap the row lines (or word lines) of the DRAM above the supply voltage in order to restore the full supply voltage into the memory cells.

FIG. 1 shows a conventional DRAM decoder circuit 10 in which a boot-strapped voltage RHX is generated by a boot-strap clock generator 12 and then decoded through boot-strapped predecode circuits 14 which generate row decoder signals R1-R4. Row decoder signals R1-R4 are then distributed throughout the DRAM chip to all of the row decoder circuits 16. The regular predecode signals 17 generated by the regular decoders 18 are routed to the inputs of a dynamic NAND gate (not shown in FIG. 1) in each of the row decoders so that only one row decoder is selected.

As explained in greater detail below, speed is limited in the circuit 10 by the loading on the bootstrap clock generator 12 and the pass transistors and by the loading of the predecode circuits 14. Also, since the boot-strapped voltage RHX must be distributed to all of the row decoders throughout the DRAM chip, the speed to the row decoder physically located the farthest from the boot-strapped predecode circuits 14 will limit the access time of the chip.

In addition, it is necessary in most DRAM designs to use a double boot-strapped node not only in the row decoder circuits 16, but also in the predecode circuits 14. These double boot-strapped nodes are extremely sensitive to leakage and can, therefore, cause reliability problems and degrade the speed of the chip should a leakage path develop.

FIG. 2 shows schematic detail of a conventional row decoder circuit 16. As stated above, the regular predecode lines 17 are the inputs to a dynamic NAND gate 22 which generates a low logic level if this particular row decoder 16 is selected by the input address. An inverter 24 then generates a high level signal in response to the low level input. Since the gates of isolation transistors 26 are connected to the supply voltage Vdd, the source nodes 28 of isolation transistors 26 will only be charged to Vdd-Vtn, where Vtn is the N-channel threshold voltage. After sufficient time to insure that the source nodes 28 of isolation transistors 26 are all charged in the selected decoder, the boot-strap clock generator 12 (FIG. 1) generates signal RHX, which in turn is decoded into signals R1-R4, causing one of the signals R1-R4 to go high and, eventually, to go to a voltage level that is above the supply voltage Vdd.

For purposes of this discussion, assume that signal R1 is selected and goes to a high voltage. As node R1 rises, its voltage level is transferred through N-channel pass transistor 30, since the gate of pass transistor 30 is node 28 and was previously charged to a high level. In addition, however, signal R1 going high causes a boosting effect on node 28 due to the gate-to-drain capacitance of the pass transistor 30. This causes node 28 to rise above the supply voltage Vdd. As signal R1 continues to rise, node 28 also rises higher such that node 28 is always at a higher potential than node R1. The full bootstrapped voltage of node R1 can thus be transferred to word line WL1. The result of this operation is that node 28 is double boot-strapped, since it is at a voltage even higher than the boot-strapped voltage of node R1.

The speed limitation of the above-described conventional decoder circuit 10 arises from the fact that the boosted voltage is generated on the periphery of the chip and has to be routed throughout the chip to all of the row decoders 16. The high going edge of the boosted voltage also must be delayed until the source node 28 of isolation transistor 26 of the worst case decoder is charged. In addition, the boosted voltage must pass through at least two pass transistors to be decoded to the proper word lines (one transistor is pass transistor 30; the other transistor is in the bootstrap predecode circuit shown in FIG. 1). All of these factors combine to inhibit the speed of the device.

In terms of reliability, the double boot-strapped node 28 could become a liability as chip geometries shrink. Care must be taken in the layout and processing of the circuit to insure that this high voltage does not have a leakage path either at time zero or after thousands of hours of use. Should a leakage path develop, the circuit could lose speed and possibly even stop functioning, depending upon the magnitude of the leakage.

SUMMARY OF THE INVENTION

The present invention provides a boot-strapped decoder circuit that provides a boot-strapped voltage at the output with improved speed and reliability. The new circuit offers a distinct speed improvement over conventional decoder circuits due to its less complex timing requirements. Reliability is also improved by the elimination of a double boot-strapped node that is essential to conventional decoder circuits.

A boot-strapped decoder circuit in accordance with the present invention activates a selected word line output in response to an input address. The decoder circuit includes a plurality of row decoders, each of which has a plurality of word line outputs. The row decoders respond to a select signal that identifies one of the row decoders as a selected row decoder. The select signal is generated by a regular predecoder based on the most significant bits of the input address. Low order predecode circuitry utilizes the least significant bits of the input address to generate a low order predecode signal. The selected row decoder includes boosting means coupled to each of its outputs and responsive to the low order predecode signal for generating a boot-strapped output voltage on a selected word line output of the selected row decoder.

Thus, a decoder circuit in accordance with the present invention generates a boot-strapped voltage output by directly coupling a boosting capacitor to the individual decoder outputs. The boot-strapped voltage is generated without the need to double boot-strap any internal nodes in the circuit, resulting in improved long-term reliability. The boot-strapped voltage is generated locally within each output driver, thereby eliminating the need for busing the boot-strapped voltage to a larger number of circuits located all over the chip surface. Moreover, all inputs to the circuit can be standard CMOS logic levels, thereby simplifying the control logic and speeding the access path through the decoder.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 3:
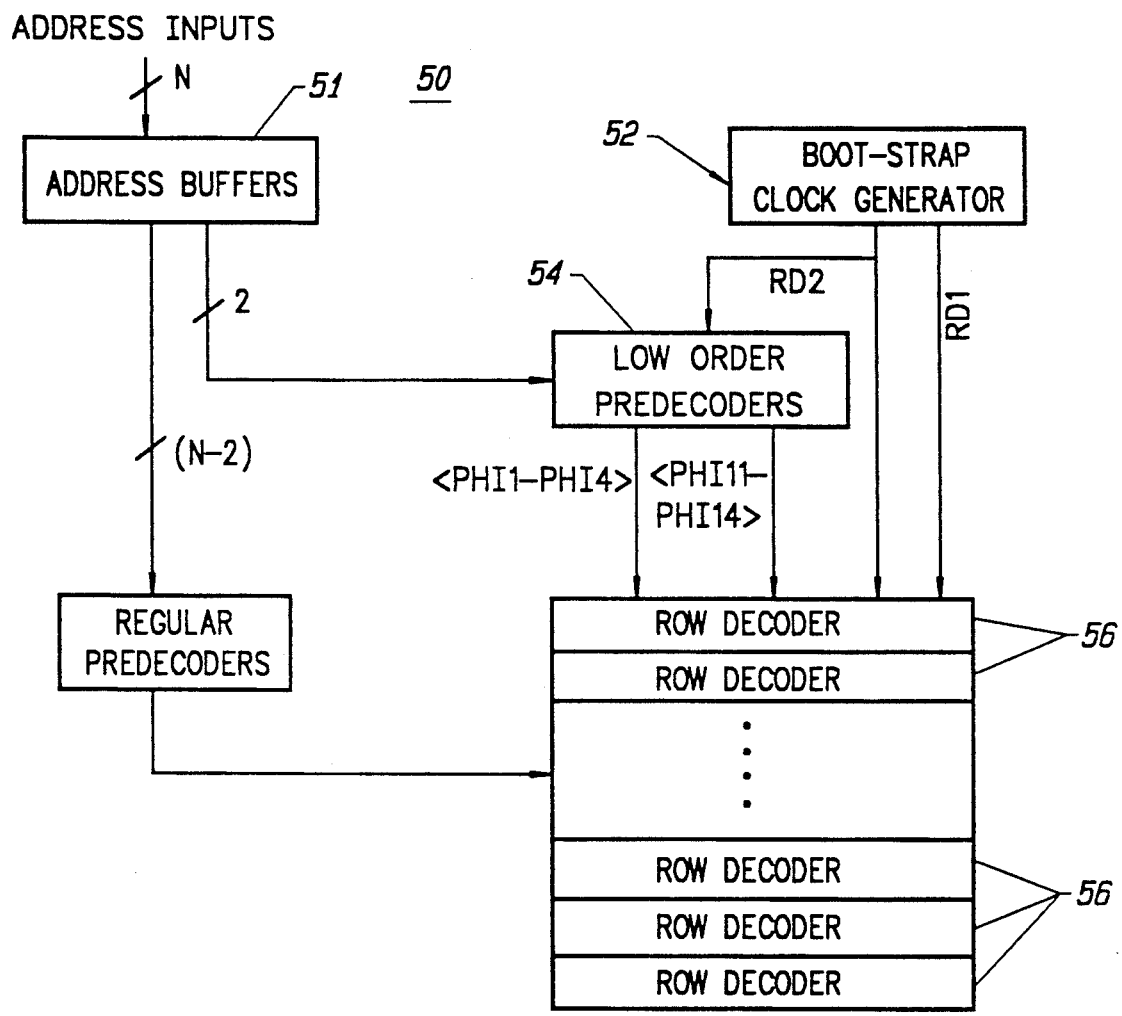
FIG. 3 is a block diagram illustrating a boot-strapped decoder circuit in accordance with the present invention.

FIG. 3 shows a block diagram of a boot-strapped decoder circuit 50 in accordance with the present invention.

Figure 1:
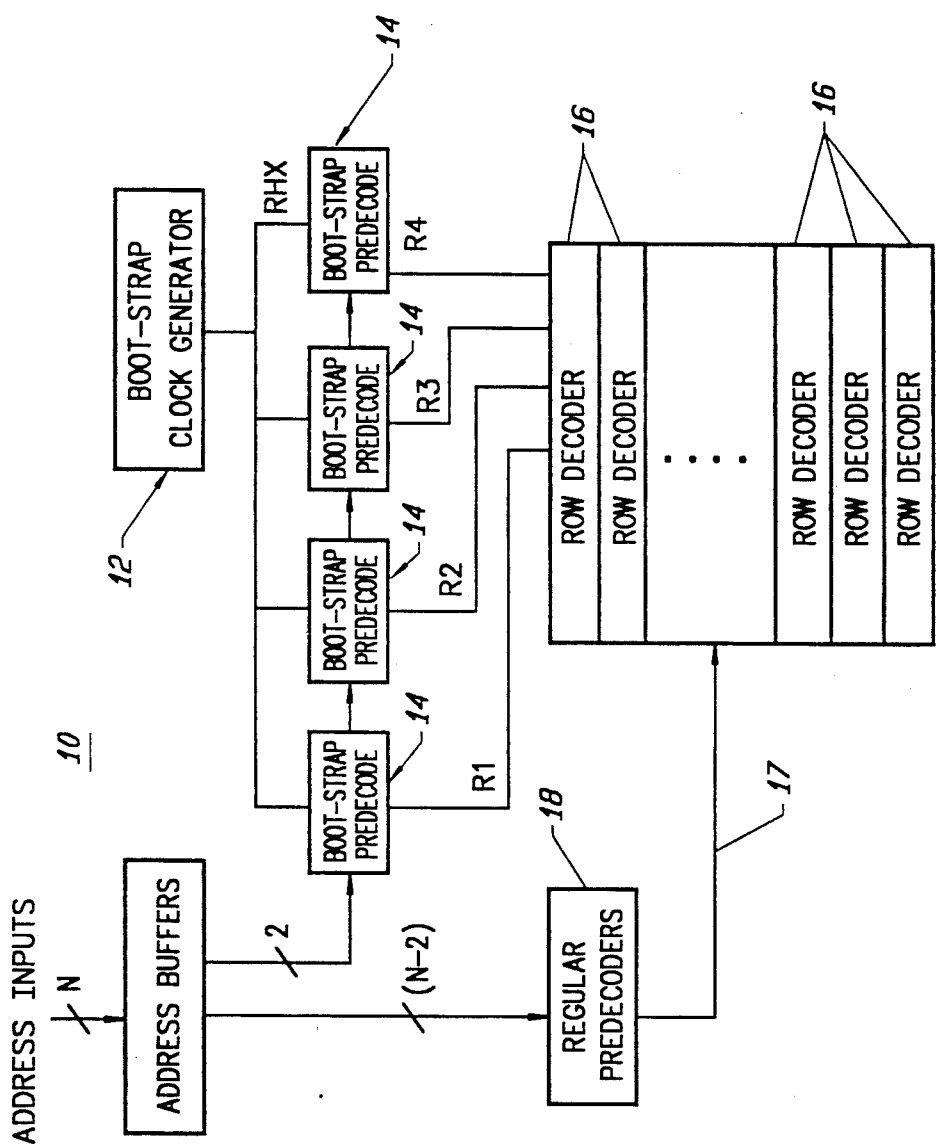
FIG. 1 is a block diagram illustrating a conventional decoder circuit.
Figure 2:
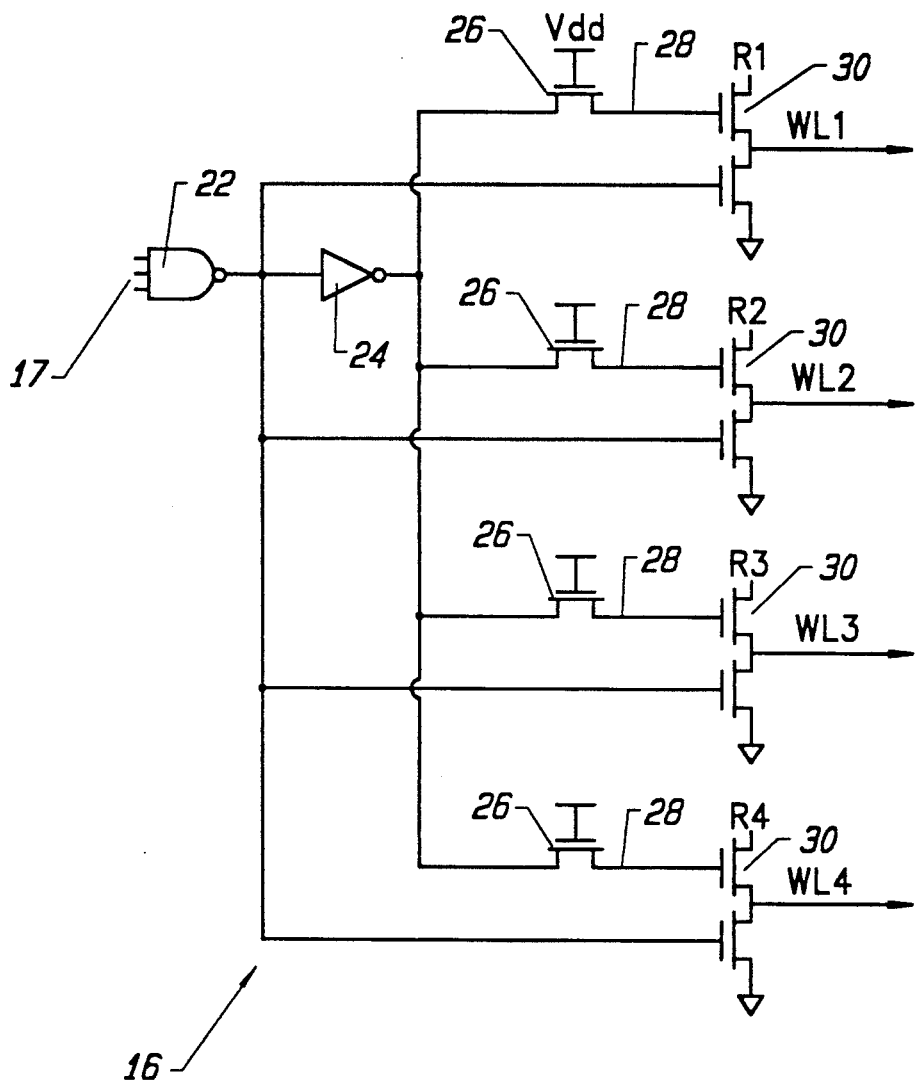
FIG. 2 is a schematic diagram illustrating a conventional row decoder circuit.

The decoder circuit 50 is similar to the decoder circuit 10 described above in conjunction with FIGS. 1 and 2, but with several significant differences. In the case of the decoder circuit 50, the boosted voltage is not generated on the periphery of the chip and routed throughout. Furthermore, in circuit 50, the only required control logic 52 are standard clocking circuits that require no special design techniques and can be implemented with standard gates. Also, instead of the boot-strapped predecoders of the conventional circuit 10, only standard predecoders 54 with some timing control are utilized; these standard predecoders are identified as low order predecoders 54 in FIG. 3. Thus, a decoder design in accordance with the present invention effectively eliminates the double boot-strapped nodes in the control section of the conventional circuitry.

From the standpoint of device speed, signal RD1 in circuit 50 is generated after the low order predecoders 54 have had time to select one of the row decoders 56. Since the signal RD1 is a standard logic level signal, there are no special drivers required for it and it can be driven throughout the bank of row decoders 56 quite quickly. A second standard logic signal RD2 is applied later in the cycle to accomplish the boot-strapping of the selected word line.

Figure 4:
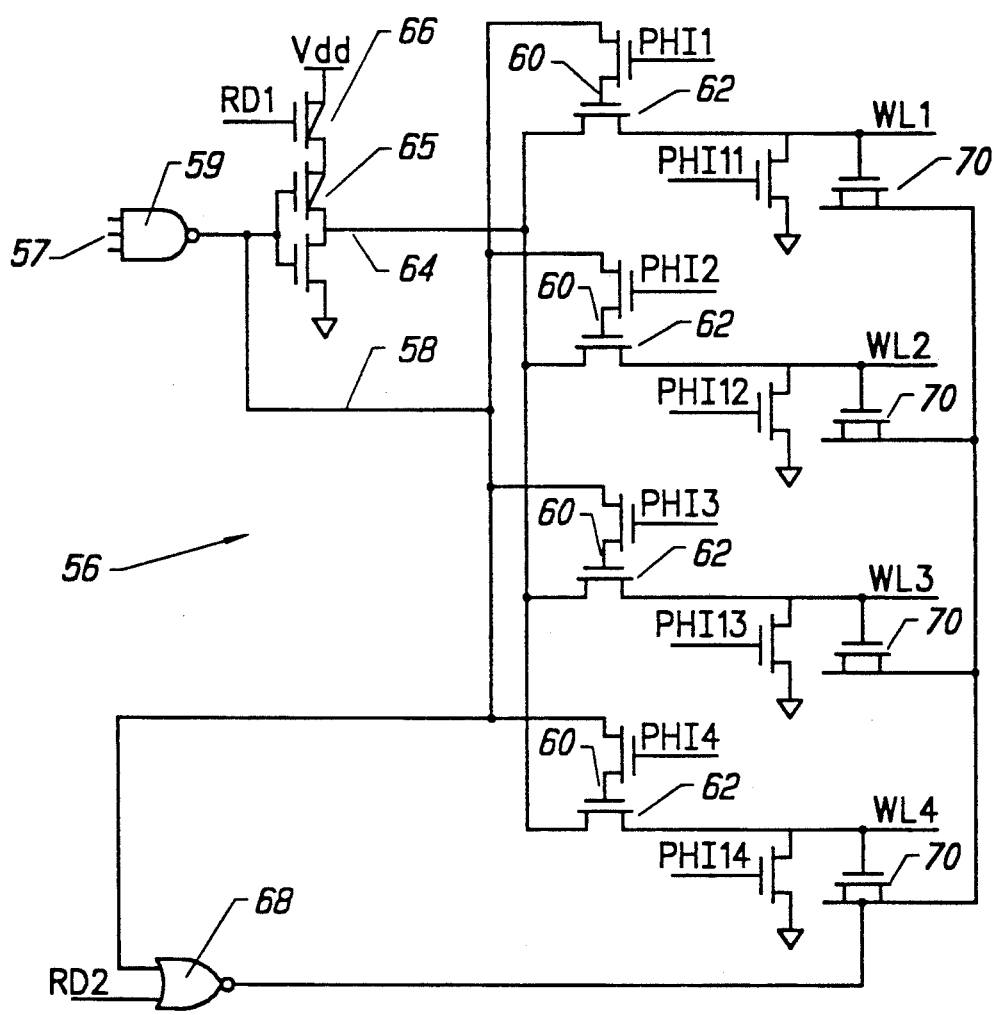
FIG. 4 is a schematic diagram illustrating a row decoder circuit in accordance with the present invention.
Figure 5:
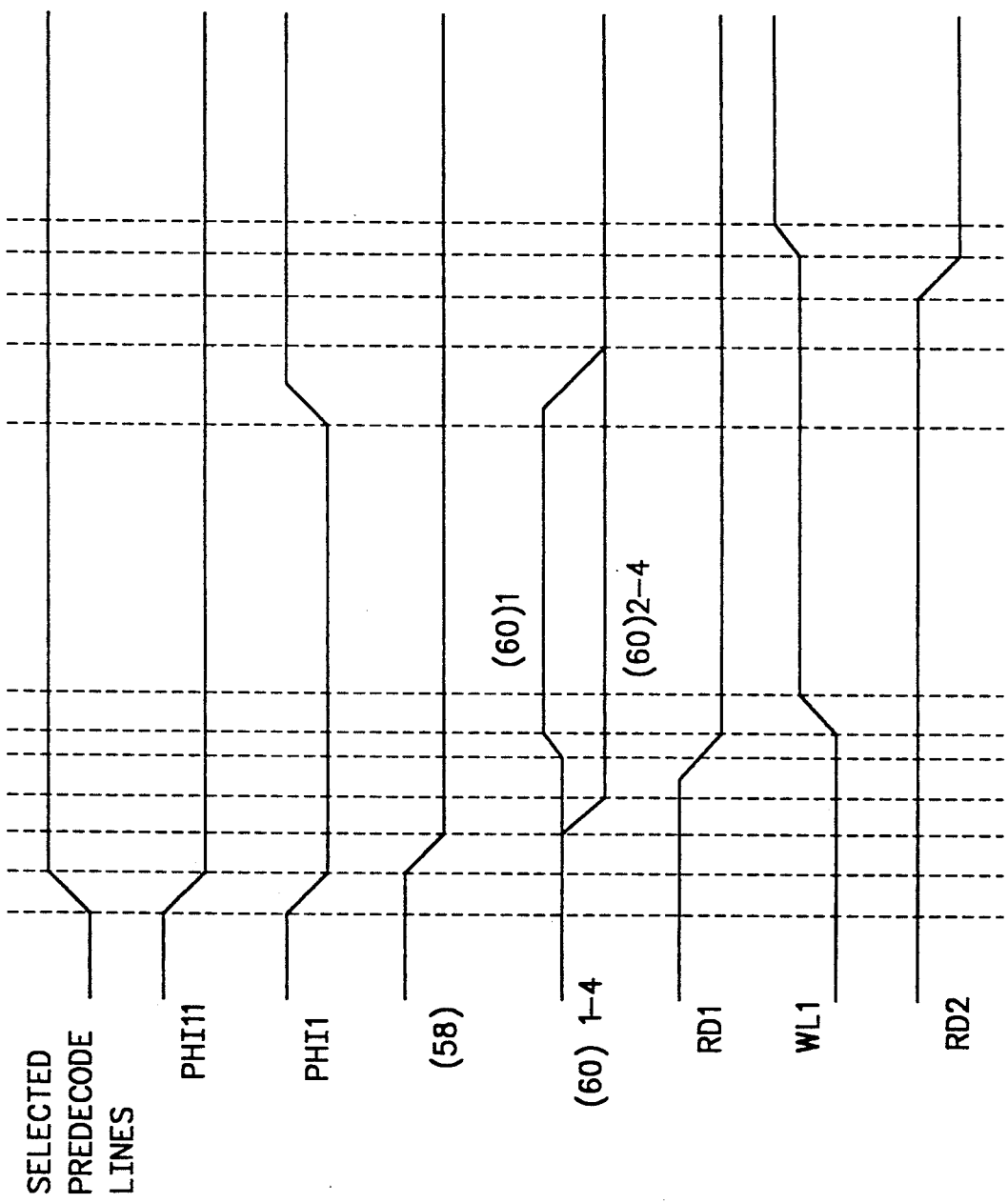
FIG. 5 provides voltage waveforms for various signals generated in the operation of the FIG. 4 row decoder circuit.

Refer now to FIG. 4 for a detailed description of the decoder circuitry 50. FIG. 5 shows voltage waveforms for the various signals generated in the decoder circuit 50.

Initially, the predecode lines 57 that correspond to the N address inputs latched in the address buffer 51 begin to rise. Also as a function of the address inputs, one of the outputs PHI-1–PHI-4 from the low order predecoders 54 is pulled to a low logic level. In addition, at the same time, the corresponding low-order predecode output PHI-11–PHI-14 is pulled low.

For example, referring to FIG. 5, signals PHI-1 and PHI-11 are both pulled low, while all other outputs from the low order predecoders 54 remain high. As a result of its predecode lines going high, NAND gate 59 of the selected row decoder 56 drives its output node 58 to a low level. Also, since signals PHI-2, PHI-3 and PHI-4 are still high, the corresponding nodes 60 in the selected row decoder 56 also go low, thereby turning off their corresponding pass transistors 62. Since signal PHI-1 remains high, its corresponding pass transistor 62 is turned on, thereby connecting node 64 with word line WL1.

A short time later, as shown in FIG. 5, signal RD1 goes low, which is timed by some small delay after the predecode signals are known to be active. Note that signal RD1 connects to only one transistor 66 in each row decoder, which makes that loading relatively small and, therefore, allows the signal to transition rapidly. The falling edge of signal RD1 turns on P-channel transistor 66 in the selected row decoder 56 and causes node 64 to go high, since P-channel transistor 65 is held on by the output of NAND gate 59. Since the pass transistor 62 connected to the word line WL1 is on, the high voltage on node 64 is transferred to word line WL1, causing word line WL1 to begin to rise. As node 64 and, thus, word line WL1 rise, there is a coupling effect from the drain and source capacitance to the gate of pass transistor 62, which causes node 60 to self-boot-strap above the supply voltage Vdd. This self boot-strapping effect allows the full supply voltage level to be transferred from node 64 to word line WL1.

After a period of time, when it is desired to have a boot-strapped voltage level on word line WL1, signal PHI-1 first must go high to discharge the high voltage on node 60. Then signal RD2 is triggered low, causing NOR-gate 68 to output a high level, which boot-straps word line WL1 by means of capacitor 70. Note that the capacitors 70 on the unselected word lines WL2, WL3 and WL4 do nothing, since they are MOS capacitors and their gates are connected to their respective word lines and are, therefore, in the "Off" state.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A boot-strapped decoder circuit that activates a selected word line output of the decoder circuit in response to an input address, the decoder circuit comprising:
   (a) a plurality of row decoders, each row decoder having a plurality of word line outputs, the plurality of row decoders being responsive to a row decoder select signal for selecting one of the row decoders as a selected row decoder;
   (b) regular predecoder means responsive to a first portion of the input address for generating the row decoder select signal; and
   (c) low order one decoder means responsive to a second portion of the input address for generating a low order predecode output signal,
   wherein the selected row decoder includes boosting means coupled to each of the word line outputs of the selected row decoder and responsive to the low order predecode output signal for generating a boot-strapped voltage output signal on a selected word line output of the selected row decoder.

2. A decoder circuit that activates one of a plurality of word line outputs of the decoder circuit in response to an input address, the input address comprising a most significant bit (MSB) portion and a least significant bit (LSB) portion, the decoder circuit comprising:

(a) regular predecoder means responsive to the MSB portion of the input address for generating a row decoder select signal that selects a selected row decoder;

(b) a boot-strap clock generator that asserts a first logic signal after the selected row decoder has been selected and asserts a second logic signal a predefined time period after the first logic signal has been asserted;

(c) low order one decoder means responsive to the LSB portion of the input address and to the second logic signal for generating first and second low order predecode output signals; and (d) a plurality of row decoders responsive to the row decoder select signal such that one of the plurality of row decoders is selected as a selected row decoder, the selected row decoder comprising:

(i) select means responsive to the row decoder select signal for asserting a row decoder drive signal;

(ii) supply voltage means connected to receive a supply voltage signal and responsive to the first logic signal and to the row decoder drive signal for providing a supply voltage output signal;

(iii) a word line;

(iv) gate means connected between the supply voltage means and the word line and responsive to the row decoder drive signal and the first low order predecode output signal for transferring the supply voltage output signal to the word line;

(v) boot-strap trigger means responsive to the row decoder select signal and to the second logic signal for generating a boot-strapped trigger signal; and (vi) a boot-strap means responsive to the boot-strapped trigger signal for boot-strapping the supply voltage output signal to provide a boot-strapped voltage output on the word line.

3. A decoder circuit as in claim 2 wherein the select means comprises a NAND gate that responds to the row decoder select signal by driving its output node low.

4. A decoder circuit that activates one of a plurality of word line outputs of the decoder circuit in response to an input address, the input address comprising a most significant bit (MSB) portion and a least significant bit (LSB) portion, the decoder circuit comprising:

(a) regular predecoder means responsive to the MSB portion of the input address for generating a row decoder select signal that selects a selected row decoder;

(b) a boot-strap clock generator that asserts a first logic signal after the selected row decoder has been selected and asserts a second logic signal a predefined time period after the first logic signal has been asserted;

(c) low order decoder means responsive to the LSB portion of the input address and to the second logic signal for generating first and second low order predecode output signals; and (d) a plurality of row decoders responsive to the row decoder select signal such that one of the plurality of row decoders is selected as a selected row decoder, the selected row decoder comprising (i) a select NAND gate that responds to the row decoder select signal by asserting a low logic level row decoder drive signal at its output node;

(ii) supply voltage means connected to receive a supply voltage signal and responsive to the first logic signal and to the row decoder drive signal for providing a supply voltage output signal, the supplying voltage means including a first p-channel supply transistor having its source connected to receive the positive supply voltage signal and its gate connected to receive the first logic signal, a second p-channel supply transistor having its source connected to the drain of the first p-channel supply transistor, its gate connected to the output node of the NAND gate and its drain connected to a supply voltage output node, and a n-channel supply transistor having its drain connected to the output node, its source connected to ground and its gate connected to the output node of the NAND gate whereby the supply voltage output node goes high in response to assertion of the first logic signal at the gate of the first p-channel supply transistor and to the output node of the NAND gate going low;

(iii) a word line;

(iv) gate means connected between the supply voltage means and the word line and responsive to the row decoder drive signal and the first low order predecode output signal for transferring the supply voltage output signal to the word line;

(v) boot-strap trigger means responsive to the row decoder select signal and to the second logic signal for generating a boot-strapped trigger signal; and (vi) a boot-strap means responsive to the boot-strapped trigger signal for boot-strapping the supply voltage output signal to provide a boot-strapped voltage output on the word line.

5. A decoder circuit as in claim 4 wherein the gate means comprises a first n-channel gate transistor connected between the supply voltage output node and the word line and a second n-channel gate transistor connected between the output node of the NAND gate and the gate of the first gate transistor, the gate of the second gate transistor connected to receive the first low order predecode output signal.

6. A decoder circuit as in claim 5 wherein the boot-strap trigger means comprises a NOR-gate responsive to the row decoder select signal and the second logic signal applied at first and second of its inputs, respectively, for providing the boot-strap trigger signal at its output node.

7. A decoder circuit as in claim 6 wherein the boot-strap means comprises an MOS capacitor having its substrate connected to the NOR-gate output node and its gate connected to the word line.

* * * * *